US012290170B2

(12) United States Patent
Chen et al.

(10) Patent No.: US 12,290,170 B2
(45) Date of Patent: May 6, 2025

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 298 days.

(21) Appl. No.: 17/499,851

(22) Filed: Oct. 12, 2021

(65) Prior Publication Data
US 2022/0395095 A1 Dec. 15, 2022

(30) Foreign Application Priority Data
Jun. 9, 2021 (TW) .................................. 110121283

(51) Int. Cl.
H05K 7/14 (2006.01)
A47B 88/43 (2017.01)
A47B 88/477 (2017.01)
A47B 88/493 (2017.01)
A47B 88/407 (2017.01)

(52) U.S. Cl.
CPC ............ *A47B 88/493* (2017.01); *A47B 88/43* (2017.01); *A47B 88/477* (2017.01); *H05K 7/1489* (2013.01); *A47B 88/407* (2017.01); *A47B 2210/0008* (2013.01); *A47B 2210/0045* (2013.01)

(58) Field of Classification Search
CPC ...... H05K 7/1489; H05K 7/183; A47B 88/43; A47B 88/493; A47B 88/49; A47B 2210/0059; A47B 88/487
See application file for complete search history.

(56) References Cited

U.S. PATENT DOCUMENTS 3,485,539 A  * 12/1969 Vaughn ................ A47B 88/493
                                                                  384/19
8,147,011 B2    4/2012 Chen et al.
9,089,215 B1 *  7/2015 Wu ....................... H05K 7/1489
(Continued)

FOREIGN PATENT DOCUMENTS

JP      2-149215 A     6/1990
JP      5514379 B2     6/2014
(Continued)

Primary Examiner — Kimberley S Wright
(74) Attorney, Agent, or Firm — Winston Hsu

(57) ABSTRACT

A slide rail assembly including a first rail, a second rail, a third rail, a first supporting device, and at least one supporting member is provided. The first rail includes a first end portion and a second end portion that are opposite to each other. The second rail is longitudinally movable relative to the first rail. The third rail is longitudinally movable relative to the second rail. The first supporting device exceeds the first end portion of the first rail for a predetermined longitudinal distance. The at least one supporting member is arranged on one of the second rail and the first supporting device.

14 Claims, 17 Drawing Sheets

(56) References Cited

U.S. PATENT DOCUMENTS

| | | | |
|---|---|---|---|
| 9,848,702 B2 | 12/2017 | Chen | |
| 10,159,343 B2 | 12/2018 | Chen et al. | |
| 10,588,409 B2 | 3/2020 | Chen | |
| 2011/0135224 A1* | 6/2011 | Chen | F16C 29/04 384/49 |
| 2013/0259411 A1* | 10/2013 | Judge | F16C 29/04 384/49 |
| 2013/0334766 A1* | 12/2013 | Okamoto | B65H 1/266 271/145 |
| 2014/0265786 A1* | 9/2014 | Chen | A47B 88/43 312/334.1 |
| 2015/0077923 A1 | 3/2015 | Rauline | |
| 2015/0123528 A1* | 5/2015 | Wu | A47B 88/443 312/319.1 |
| 2016/0278232 A1* | 9/2016 | Chen | A47B 88/43 |
| 2016/0278234 A1 | 9/2016 | Chen | |
| 2018/0199713 A1* | 7/2018 | Chen | A47B 88/49 |
| 2018/0310710 A1* | 11/2018 | Chen | A47B 88/423 |

FOREIGN PATENT DOCUMENTS

| | | |
|---|---|---|
| JP | 2017-27591 A | 2/2017 |
| JP | 2019-51292 A | 4/2019 |

\* cited by examiner

SLIDE RAIL ASSEMBLY

BACKGROUND OF THE INVENTION

1. Field of the Invention

The present invention relates to a slide rail assembly, and more particular to a slide rail assembly that increases support of slide rails when being moved relative to one another.

2. Description of the Prior Art

U.S. Pat. No. 8,147,011 B2 discloses a slide rail assembly including a first rail, a second rail, and a third rail. The third rail is movably mounted between the first rail and the second rail. The second rail includes a first rail segment and a second rail segment connected back to back. The second rail segment includes a plurality of first rollers and second rollers. When the third rail is pulled out relative to the second rail, the first rollers and the second rollers facilitates support of the third rail. Alternatively, when the third rail is pulled out for a predetermined stroke relative to the second rail, support wheels connected to a front support of the first rail can also be configured to support the third rail. This disclosure mainly discloses that, after the third rail is pulled out from the second rail, and is then to be reassembled, the support wheels of a front bracket are configured to facilitate the third rail to be easily guided to be reassembled with the second rail, and assist sliding of the third rail.

U.S. Pat. No. 10,159,343 B2 discloses a slide rail assembly including a first rail, a second rail, a third rail, a first bracket, and a second bracket. The third rail is movably mounted between the first rail and the second rail. Both the first bracket and the second bracket are movable relative to the first rail. The slide rail assembly further includes at least one rolling member, and the first bracket and the first rail are movable relative to each other through the at least one rolling member. This disclosure mainly discloses that the first bracket and the first rail are movable relative to each other through a first rolling member or a second rolling member, so as to facilitate the first bracket and the first rail to move relative to each other, such that an extending distance of the slide rail assembly relative to a rack is increased.

Japanese Patent No. JP 5514379 B2 discloses a slide rail assembly including a movable rail, a fixed rail and a pressure contact member. The movable rail and the fixed rail are movable relative to each other, and the movable rail and the fixed rail can be moved and contacted with each other relatively via the pressure contact member. The pressure contact member is a roller. This disclosure mainly discloses that when the movable rail is moved relative to the fixed rail to be adjacent to a retracted position, the roller, which serves as the pressure contact member, facilitates autonomous retraction of the movable rail relative to the fixed rail.

Although the above patent disclosures have disclosed relevant technical features of rollers (rolling members) being applied to slide rails, with different needs of the industry, developing a different slide rail product has become an important issue.

SUMMARY OF THE INVENTION

The present invention provides a slide rail assembly that increases support of slide rails when being moved relative to one another.

According to one embodiment of the present invention, a slide rail assembly includes a first rail, a second rail, a third rail, a first supporting device, and at least one supporting member. The first rail includes a first end portion and a second end portion that are opposite to each other. The second rail is longitudinally movable relative to the first rail. The third rail is longitudinally movable relative to the second rail. The first supporting device exceeds the first end portion of the first rail for a predetermined longitudinal distance. The at least one supporting member is arranged on one of the second rail and the first supporting device.

According to one embodiment of the present invention, a slide rail assembly includes a first rail, a second rail, a third rail, a first supporting device, and at least one supporting member. The second rail is longitudinally movable relative to the first rail. The third rail is longitudinally movable relative to the second rail. The first supporting device exceeds the first end portion of the first rail for a predetermined longitudinal distance. The at least one supporting member is arranged on the second rail. Each of the first rail, the second rail, and the third rail respectively includes a first end portion and a second end portion. When the second rail is longitudinally moved relative to the first rail from a retracted position to an extending position in an opening direction, the at least one supporting member supports and contacts along the first supporting device. One of the at least one supporting member and the first supporting device comprises an arced contour, and another one of the at least one supporting member and the first supporting device comprises a linear section to support and contact with the arced contour. When the second rail is positioned at the extending position relative to the first rail, the first end portion of the second rail exceeds the first end portion of the first rail. When the second rail is positioned at the extending position relative to the first rail, the third rail is able to be moved to an opening position relative to the second rail. When the third rail is positioned at the extending position relative to the second rail, the first end portion of the third rail exceeds the first end portion of the second rail.

According to yet another embodiment of the present invention, a slide rail assembly is adapted to mount an object to a rack. The rack includes a first post and a second post, the object includes a first predetermined portion and a second predetermined portion. The first predetermined portion is defined with a first width and the second predetermined portion is defined with a second width smaller than the first width. The slide rail assembly includes a first rail, a second rail, a third rail, a first supporting device, and at least one supporting member. The first rail includes a first end portion and a second end portion that are opposite to each other. The second rail is longitudinally movable relative to the first rail. The third rail is longitudinally movable relative to the second rail. The third rail is configured to be mounted to the second predetermined portion of the object. The first supporting device exceeds the first end portion of the first rail for a predetermined longitudinal distance. The first supporting device is configured to mount the first rail to the first post. The second supporting device is movable relative to the first supporting device and configured to mount the first rail to the second post. The at least one supporting member is arranged on one of the second rail and the first supporting device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
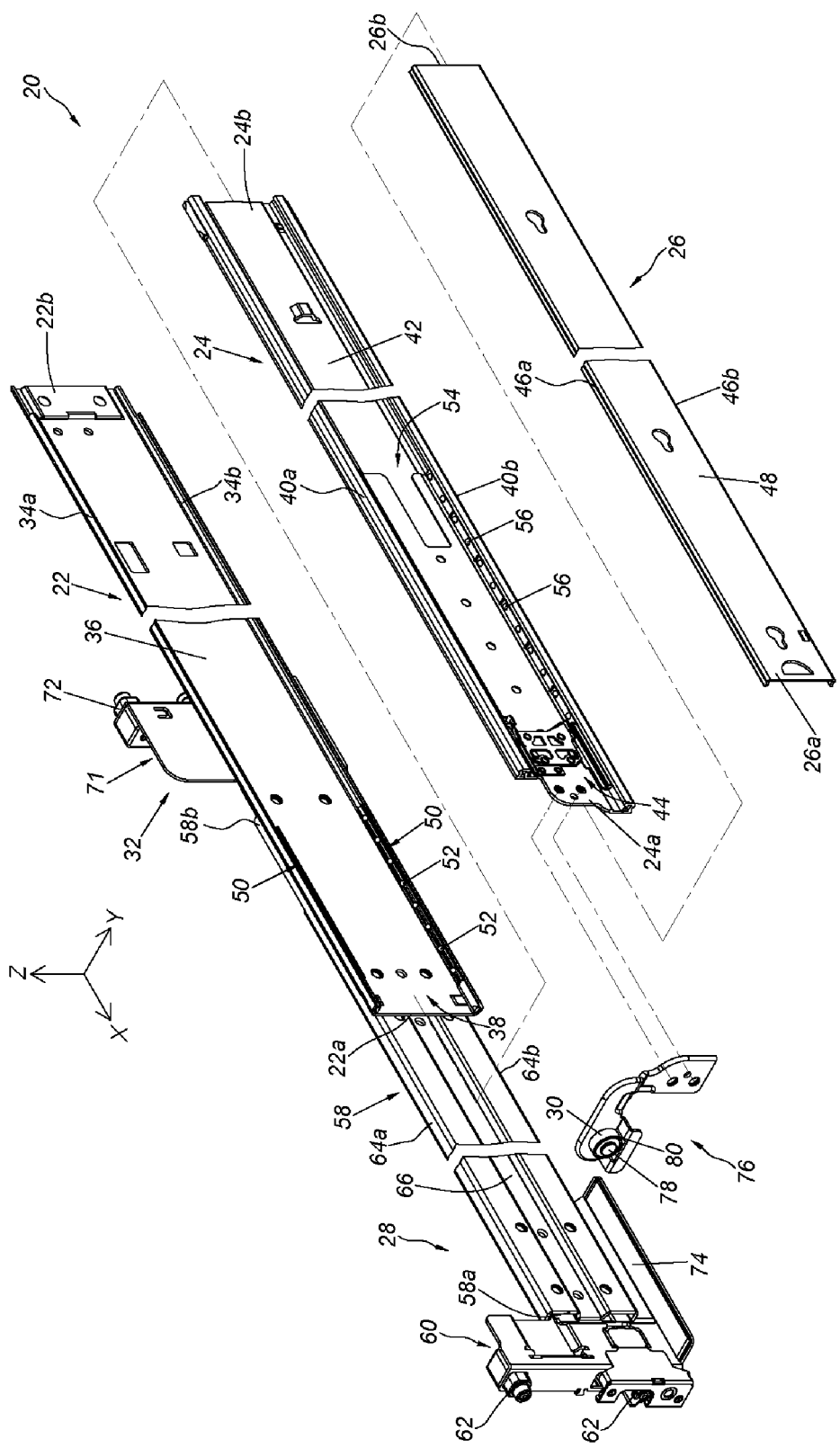
FIG. 1 is an exploded schematic view of a slide rail assembly according to a first embodiment of the present invention.
Figure 2:
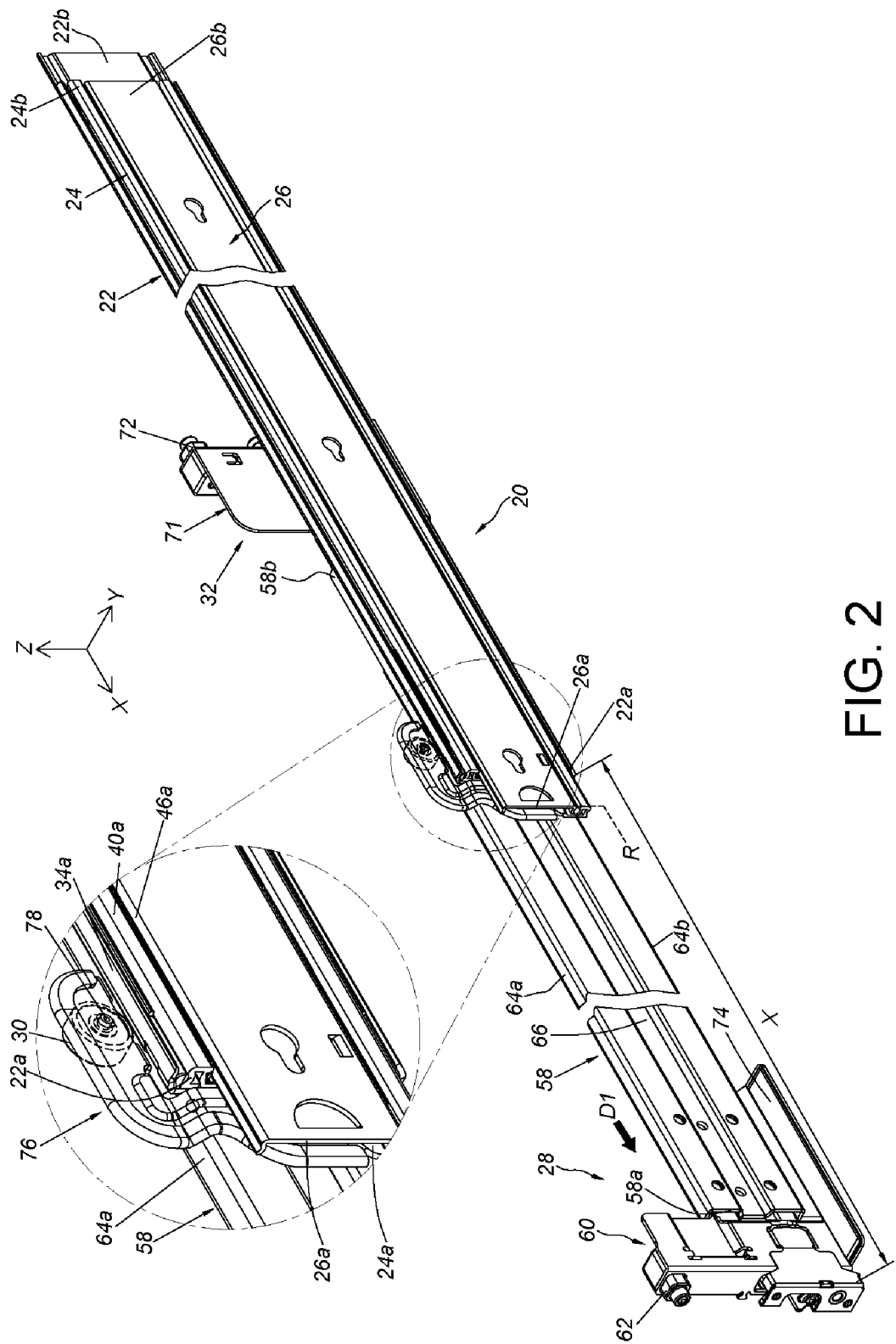
FIG. 2 is a schematic view of the slide rail assembly in a retracted state according to the first embodiment of the present invention.

As shown in FIG. 1 and FIG. 2, a slide rail assembly 20 according to a first embodiment of the present invention includes a first rail 22, a second rail 24, a third rail 26, a first supporting device 28, and at least one supporting member 30. The second rail 24 is movably mounted between the first rail 22 and the third rail 26. Preferably, the slide rail assembly 20 further includes a second supporting device 32. The first rail 22 (i.e., an outer rail), the second rail 24 (i.e., a middle rail), and the third rail 26 (i.e., an inner rail) can be longitudinally moved relative to each other. It is worth mentioning that, in this embodiment, the X-axis direction is the longitudinal direction (in other words, a longitudinal direction or a moving direction of the slide rails), the Y-axis direction is the transverse direction (in other words, a lateral direction of the slide rails), and the Z-axis direction is the vertical direction (in other words, a height direction of the slide rails).

The first rail 22 includes a first end portion 22a and a second end portion 22b opposite to each other, such as a front end and a rear end, but the present invention is not limited thereto. The first rail 22 has a first wall 34a, a second wall 34b, and a longitudinal wall 36 connected between the first wall 34a and the second wall 34b of the first rail 22. The first wall 34a, the second wall 34b, and the longitudinal wall 36 of the first rail 22 jointly define a first channel 38.

The second rail 24 is movably mounted to the first channel 38 of the first rail 22. The second rail 24 has a first end portion 24a and a second end portion 24b opposite to each other, such as a front end and a rear end, but the present invention is not limited thereto. The second rail 24 includes a first wall 40a, a second wall 40b, and a longitudinal wall 42 connected between the first wall 40a and the second wall 40b of the second rail 24. The first wall 40a, the second wall 40b, and the longitudinal wall 42 of the second rail 24 jointly define a second channel 44.

The third rail 26 is movably mounted to the second channel 44 of the second rail 24. The third rail 26 has a first end portion 26a and a second end portion 26b opposite to each other, such as a front end and a rear end, but the present invention is not limited thereto. The third rail 26 includes a first wall 46a, a second wall 46b, and a longitudinal wall 48 connected between the first wall 46a and the second wall 46b of the third rail 26.

Preferably, the slide rail assembly 20 further includes at least one first slide-aiding device 50 movably mounted between the first rail 22 and the second rail 24, and the at least one first slide-aiding device 50 includes, for example, a plurality of first balls 52, which can facilitates enhancement of smoothness between the second rail 24 and the first rail 22 when being moved relative to each other.

Preferably, the slide rail assembly 20 further includes a second slide-aiding device 54 movably mounted between the second rail 24 and the third rail 26, and the second slide-aiding device 54 includes, for example, a plurality of second balls 56, which can facilitates enhancement of smoothness between and the third rail 26 and the second rail 24 when being moved relative to each other.

The first supporting device 28 exceeds (i.e., extends beyond) the first end portion 22a of the first rail 22 for a predetermined longitudinal distance X.

Preferably, the first supporting device 28 includes a reinforcement member 58 and a first bracket 60, the reinforcement member 58 is positioned at a rear side of the first rail 22, and a direction of the reinforcement member 58 is longitudinally parallel to that of at least one of the first rail 22, the second rail 24, or the third rail 26. That is to say, the direction of the reinforcement member 58 is substantially longitudinally arranged. In one embodiment, it is exemplified that a part of the reinforcement member 58 is connected to the rear side of the first rail 22 (for example, the back side is a side opposite to the first passage 38), and another part of the reinforcement member 58 exceeds the first end portion 22a of the first rail 22 for the predetermined longitudinal distance X. Since a part of the reinforcement member 58 is connected (e.g., fixedly connected, but not limited) to the first rail 22, the structural strength of a part of the first rail 22 is enhanced. On the other hand, the reinforcement member 58 has a first end portion 58a and a second end portion 58b opposite to each other, such as a front end and a rear end, but the present invention is not limited thereto. The first bracket 60 is connected (e.g., fixedly connected, but not limited) to the reinforcement member 58, and the first bracket is positioned adjacent to the first end portion 58a of the reinforcement member 58. The first supporting device 28 further includes at least one first mounting member 62 arranged on the first bracket 60.

Figure 5:
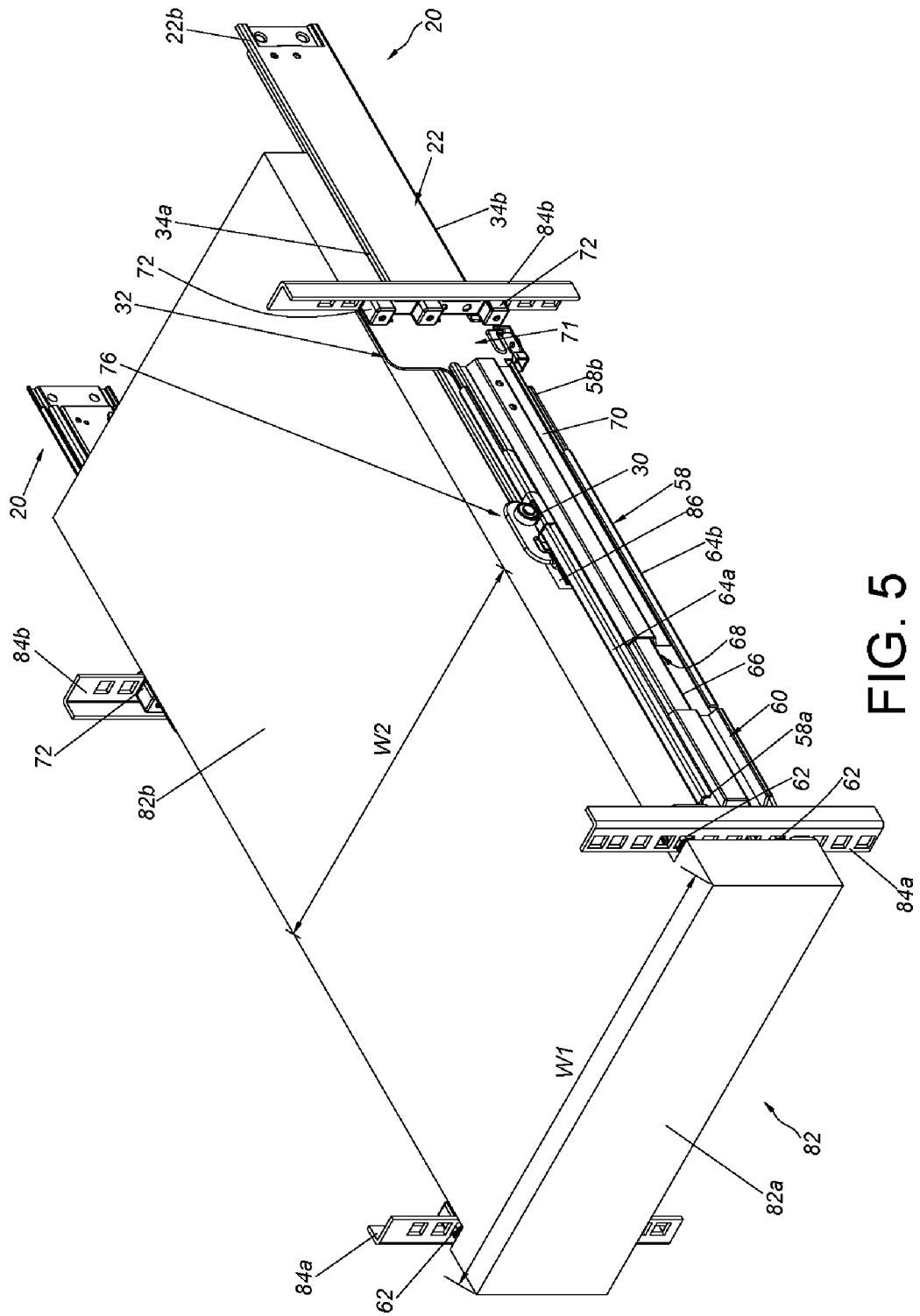
FIG. 5 is a schematic view of the object being able to be mounted to a rack through a pair of slide rail assemblies according to the first embodiment of the present invention.

Preferably, the reinforcement member 58 includes a first portion 64a, a second portion 64b, and a longitudinal portion 66 connected between the first portion 64a and the second portion 64b, and the first portion 64a, the second portion 64b, and the longitudinal portion 66 of the reinforcement member 58 jointly define a reinforcing channel 68 (as shown in FIG. 5), and the reinforcing channel 68 is positioned between the first end portion 58a and the second end portion 58b.

Preferably, the second supporting device 32 is movable relative to the first supporting device 28. Furthermore, the second supporting device 32 includes a second bracket 71, an extension bracket 70 (as shown in FIG. 5), and at least one second mounting member 72. The extension bracket 70 can be movably mounted to the reinforcing channel 68 of the reinforcement member 58, and a position of the second supporting device 32 relative to the first supporting device 28 can be adjusted through the extension bracket 70. On the other hand, the at least one second mounting member 72 is arranged on the second bracket 71.

Preferably, the first supporting device 28 further includes a supporting portion 74. For example, the supporting portion 74 is arranged on the first bracket 60, and the supporting portion 74 extends laterally (or transversally) relative to the reinforcement member 58.

The at least one supporting member 30 is arranged on the second rail 24.

Preferably, the slide rail assembly 20 further includes an auxiliary member 76 connected to the second rail 24, and the at least one supporting member 30 is rotatably mounted on the auxiliary member 76. For example, the at least one supporting member 30 is mounted to the auxiliary member 76 through a shaft 78.

Preferably, the auxiliary member 76 is connected (e.g., fixedly connected) to the second rail 24 and the auxiliary member 76 is positioned adjacent to the first end portion 24a of the second rail 24.

Preferably, when the second rail 24 is retracted relative to the first rail 22 (as shown in FIG. 2), the first end portion 24a of the second rail 24 exceeds the first end portion 22a of the first rail 22, so as to facilitate the auxiliary member 76 to be connected to the second rail 24.

Preferably, a position of the at least one supporting member 30 corresponds to one of the first portion 64a and the second portion 64b of the reinforcement member 58, and at least one of the at least one supporting member 30 and the first portion 64a and the second portion 64b of the reinforcement member 58 includes an arced contour. In one embodiment, the at least one supporting member 30 is exemplified as a rolling member or a smooth member including the arced contour. In practice, the at least one supporting member 30 can be a spherical or cylindrical object such as a roller or a ball, but the present invention is not limited thereto. The position of the at least one supporting member 30 corresponds to one of the first portion 64a and the second portion 64b of the reinforcement member 58. In one embodiment, the first portion 64a is exemplified to correspond to the reinforcement member 58. The first portion 64a of the reinforcement member 58 includes a linear section which is substantially longitudinally arranged, and the linear section is configured for contacting and supporting the arced contour. In another embodiment, one of the first portion 64a and the second portion 64b of the reinforcement member 58 includes the arced contour, and the at least one supporting member 30 includes the linear section or a planar section; or, all of the at least one supporting member 30, the first portion 64a, and the second portion 64b includes the arced contour, and the present invention is not limited thereto. That is to say, as long as the at least one supporting member 30 and at least one of the first portion 64a and the second portion 64b are movable (e.g., slidable or rotatable) relative to one another (each other) and are contacted to and supported by one another (each other), the present invention does not limit which the afore-mentioned elements includes the arced contour.

Preferably, the at least one supporting member 30 is made of plastic material.

Preferably, the auxiliary member 76 is defined with a space 80 (e.g., an opening or a gap), and the at least one supporting member 30 penetrates through the space 80 and corresponds to the first portion 64a of the reinforcement member 58.

Figure 3:
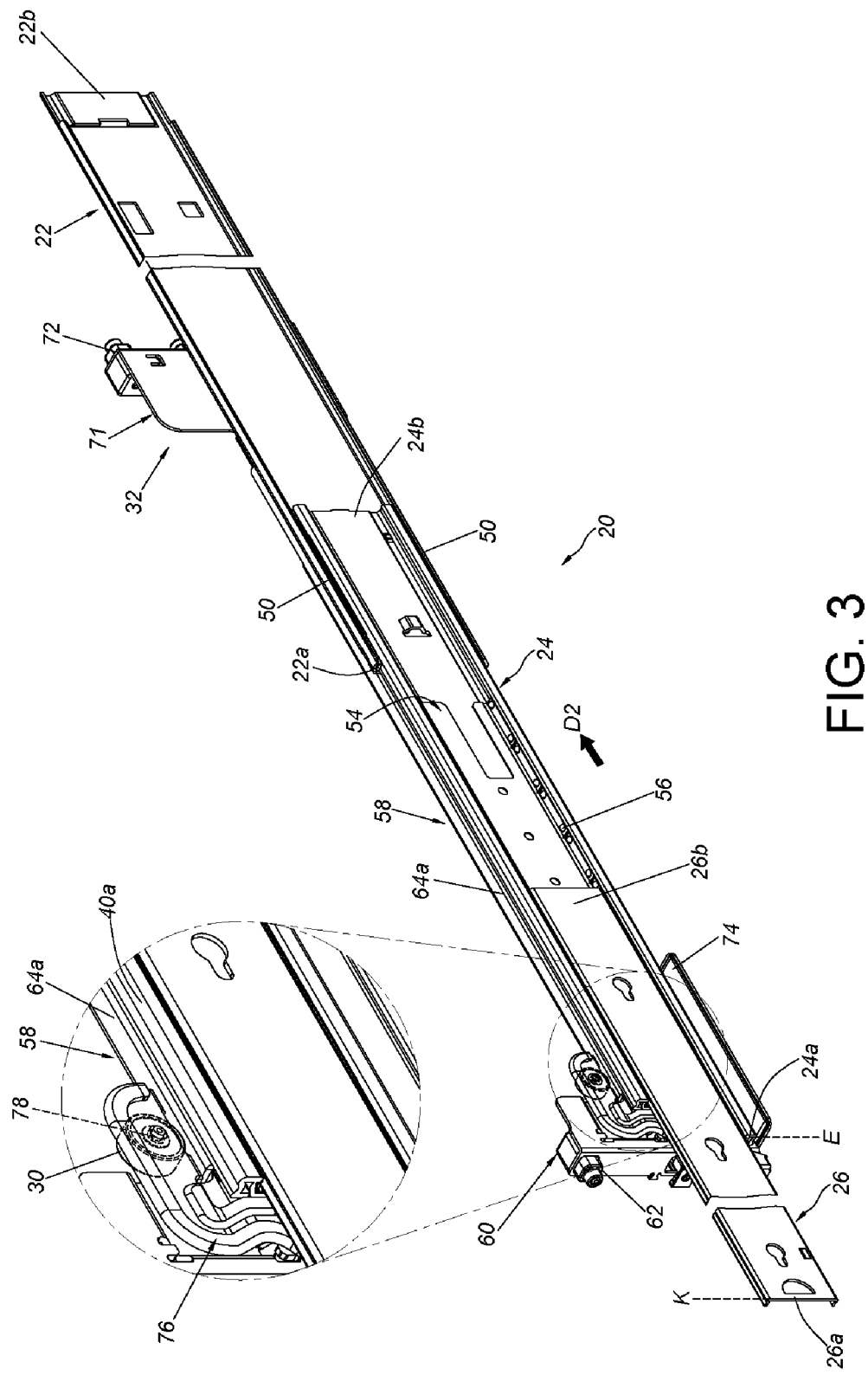
FIG. 3 is a schematic view of the slide rail assembly in an extending state according to the first embodiment of the present invention.

As shown in FIG. 2 and FIG. 3, the slide rail assembly 20 can be in a retracted state (as shown in FIG. 2, the second rail 24 and the third rail 26 are both retracted relative to the first rail 22). Furthermore, the second rail 24 can be longitudinally moved relative to the first rail 22 from a retracted position R (as shown in FIG. 2) to an extending position E (as shown in FIG. 3) in an opening direction D1. The third rail 26 can be longitudinally moved relative to the second rail 24 from the extending position E to an opening position K in the opening direction D1, so that the slide rail assembly 20 is in an extending state. When the second rail 24 is positioned at the extending position E relative to the first rail 22, the first end portion 24a of the second rail 24 exceeds the first end portion 22a of the first rail 22. When the third rail 26 is positioned at the opening position K relative to the second rail 24, the first end portion 26a of the third rail 26 exceeds the first end portion 24a of the second rail 24 (as shown in FIG. 3).

Preferably, when the slide rail assembly 20 is in the retracted state, the first end portion 26a of the third rail 26 is positioned between the at least one first mounting member 62 and the at least one second mounting member 72.

Preferably, when the slide rail assembly 20 is in the extending state (as shown in FIG. 3), the first end portion 26a of the third rail 26 exceeds the at least one first mounting member 62 for a predetermined distance.

It should be noted that since the first supporting device 28 exceeds the predetermined longitudinal distance X of the first end portion 22a of the first rail 22, when the second rail 24 is longitudinally moved relative to the first rail 22 from the retracted position R to the extending position E in the opening direction D1, the at least one supporting member 30 can support and contact along the first portion 64a of the reinforcement member 58, so as to support each other. On the other hand, when the second rail 24 is longitudinally moved relative to the first rail 22 from the extending position E to the retracted position R in the retracting direction D2, the at least one supporting member 30 can support and contact along the first portion 64a of the reinforcement member 58. Since the at least one supporting member 30 and the first portion 64a of the reinforcement member 58 are supported by and contacted with each other through the arced contour and the linear section being contacted with each other, frictional resistances, i.e., frictional forces (among the afore-mentioned elements) are reduced.

For example, the at least one supporting member 30 can move (e.g., roll or slide) along the first portion 64a of the reinforcement member 58, so as to reduce the frictional force produced when the second rail 24 is moved relative to the first rail 22, which enhances the smoothness between the second rail 24 and the first rail 22 when the second rail 24 is moved relative to the first rail 22 between the retracted position R and the extending position E, and enables addition support of the second rail 24 (or the third rail 26) relative to the first rail 22. In addition, for a user, this can effectively reduce a pulling force or a pushing force applied to the slide rails. That is, the user can easily complete an opening action or a retracting action of the slide rail assembly 20, or complete with less of required force applied.

Figure 4:
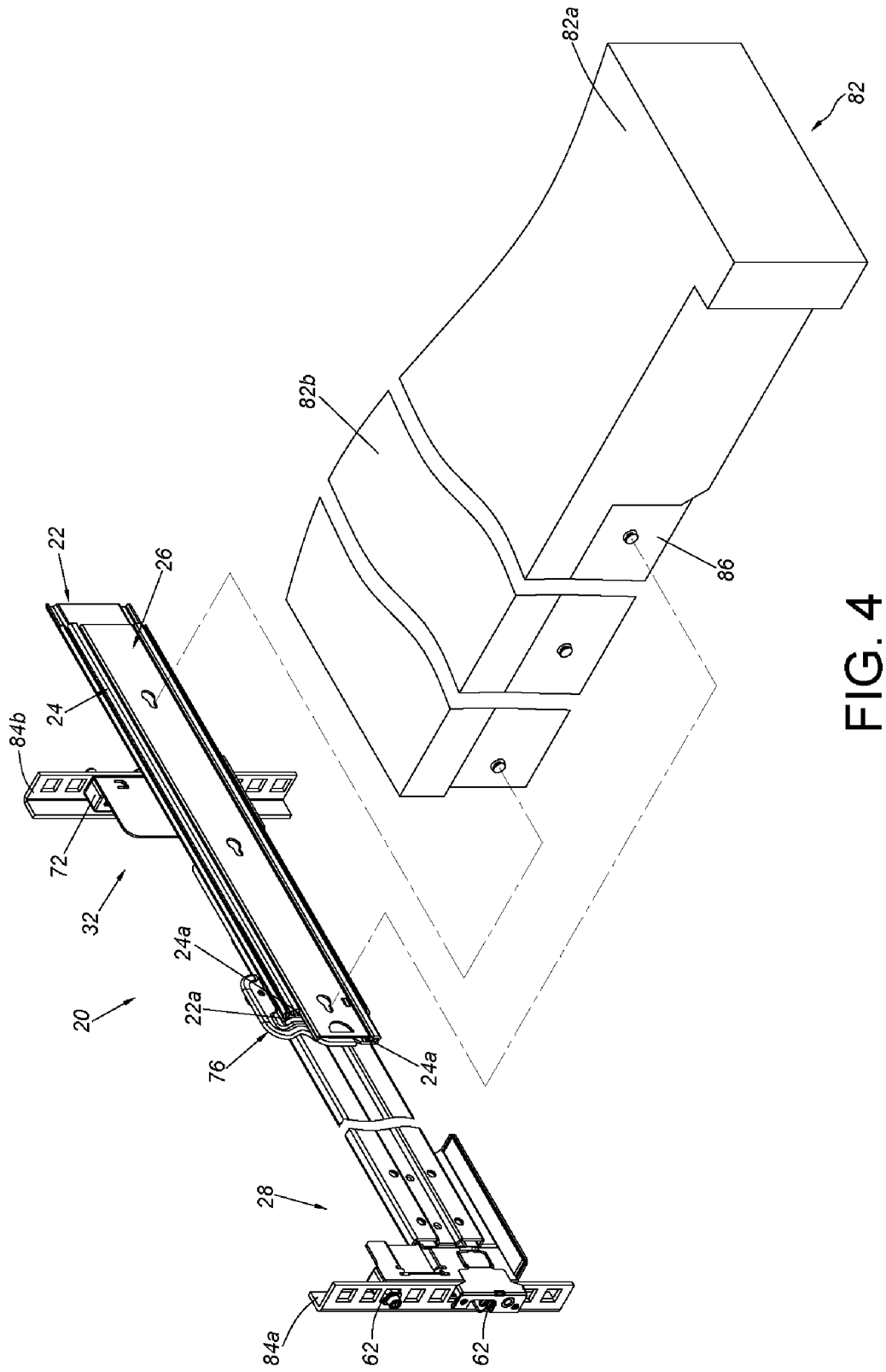
FIG. 4 is an exploded schematic view of an object being able to be mounted to a rack through the slide rail assembly according to the first embodiment of the present invention.

As shown in FIG. 4 and FIG. 5, an object 82 can be mounted to a rack through a pair of slide rail assemblies 20. The object 82 (e.g., an electronic device or an equipment housing) includes a first predetermined portion 82a and a second predetermined portion 82b, the first predetermined portion 82a has a first width W1, and the second predetermined portion 82b has a second width W2 smaller than the first width W1. The rack includes a pair of first posts 84a and a pair of second posts 84b. The first rail 22 of each of the slide rail assemblies 20 can be mounted to each of the first posts 84a through the first supporting device 28, and the first rail 22 of each of the slide rail assemblies 20 can be mounted to each of the second posts 84b through the second supporting device 32.

Preferably, the first rail 22 of each of the slide rail assemblies 20 can be mounted to each of the first posts 84a and each of the second posts 84b through the at least one first mounting member 62 and the at least one second mounting member 72.

It is worth mentioning that, since the object 82 has a special shape (e.g., a shape that is relatively wider at the front and relatively narrower at the rear), the third rail 26 of each slide rail assembly 20 can only be partially mounted to a side 86 of the second predetermined portions 82b of the object 82. When each of the slide rail assemblies 20 is in the retracted state, the first end portions 22a of the first rail 22, the first end portions 24a of the second rail 24, and the first end portions 26a of the third rail 26 substantially correspond to a middle position of the object 82. It should be noted that, the second rail 24 of this embodiment can be supported by and contacted along (the first portion 64a of) the reinforcement member 58 through the at least one supporting member 30. More specifically, when each of the slide rail assemblies 20 is in the retracted position, the position of the at least one supporting member 30 is substantially positioned at the middle position of two sides of the object 82, thereby enhancing the support of the third rail 26 and the second rail 24 against the object 82 having the special shape.

Figure 6:
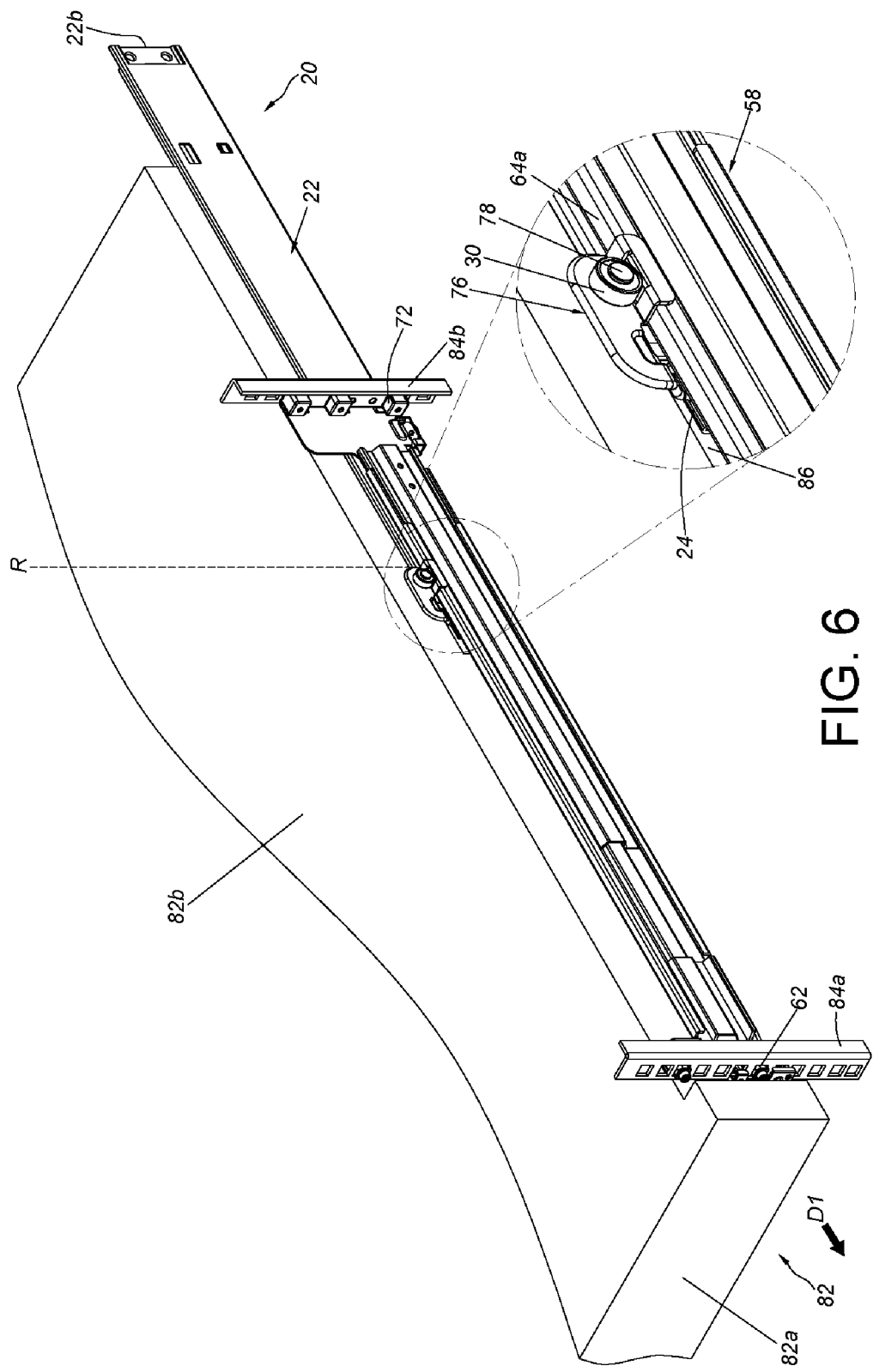
FIG. 6 is a partial schematic view of the object being able to be positioned inside the rack through the slide rail assembly being in the retracted state according to the first embodiment of the present invention.
Figure 7:
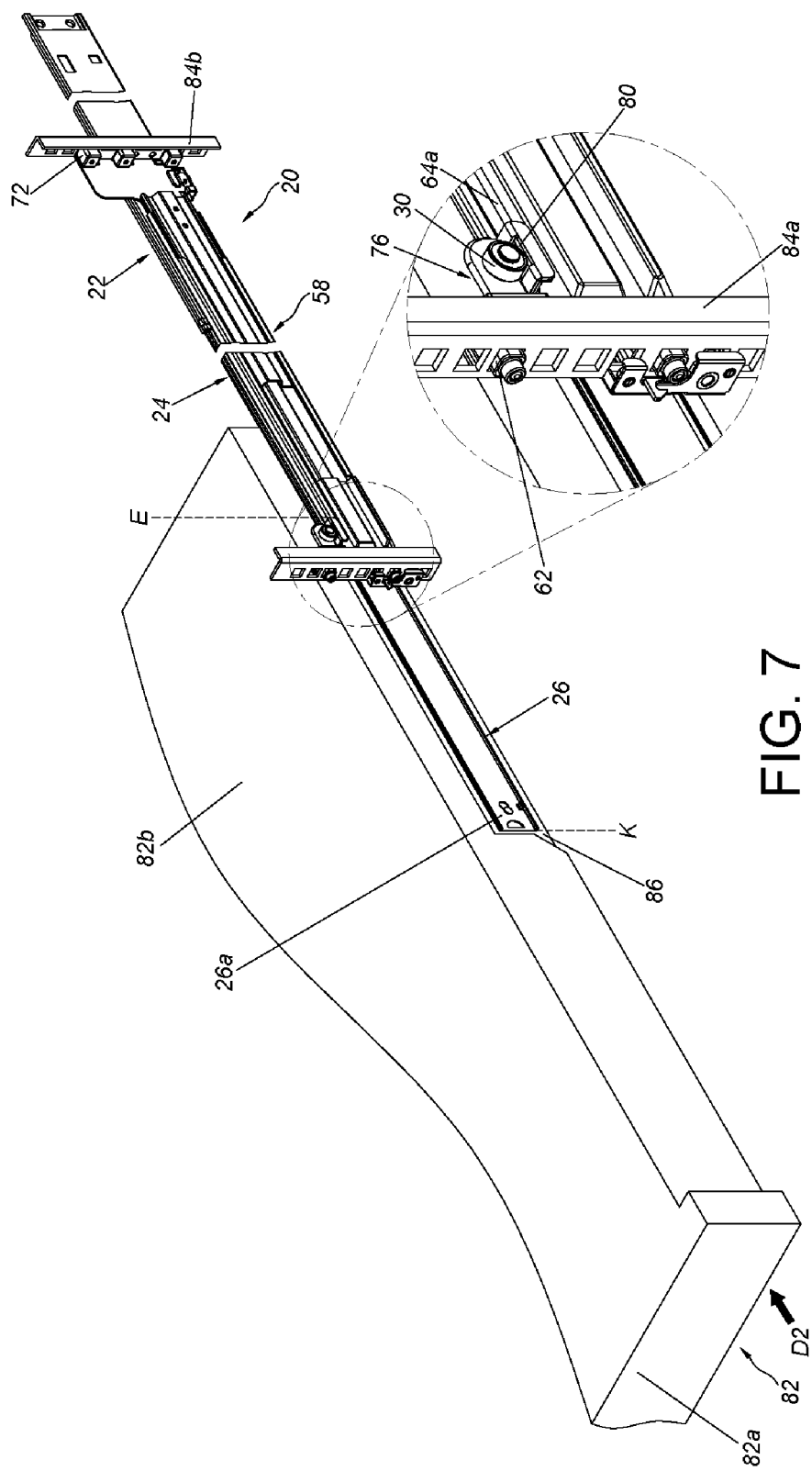
FIG. 7 is a partial schematic view of the object being able to be positioned outside the rack through the slide rail assembly being in the extending state according to the first embodiment of the present invention.

As shown in FIG. 6 and FIG. 7, the user can apply a pulling force to the object 82 in the opening direction D1, so that the slide rail assembly 20 can be moved from the retracted state (as shown in FIG. 6) to the extending state (as shown in FIG. 7), and the object 82 can be moved from the inside of the rack to the outside of the rack. Alternatively, the user can apply a pushing force in the retracting direction D2 to the object 82, so that the slide rail assembly 20 can be moved from the extending state (as shown in FIG. 7) to the retracted state (as shown in FIG. 6). In this way, the object 82 can be moved from the outside of the rack to the inside of the rack.

It should be noted that, when the slide rail assembly 20 is in the extending state, the first end portion 26a of the third rail 26 exceeds the predetermined distance between the at least one first mounting member 62 and the first post 84a (as shown in FIG. 7), and when a weight of other parts of the object 82 (including the first predetermined portion 82a) that are not supported by the third rail 26 is heavy enough, the support provided by the third rail 26 and the second rail 24 can be affected (e.g., due to unbalance of weights). However, since the second rail 24 of this embodiment can be supported by and contacted along (the first portion 64a of) the reinforcement member 58 through the at least one supporting member 30, thereby enhancing the support of the third rail 26 and the second rail 24 against the object 82 having the special shape.

In addition, since the at least one supporting member 30 and the reinforcement member 58 (the first portion 64a) are supported by each other through the arced contour and the linear section being contacted with each other, the frictional forces produced when the second rail 24 is moved relative to the first rail 22 are reduced, such that an effect of reducing the required force applied is achieved. For example, when the user applies the pulling force to the object 82, the second rail 24 (and the third rail 26) is moved (pulled) from the retracted position R in the opening direction D1 relative to the first rail 22, which reduces the pulling force of the second rail 24 relative to the first rail 22. On the other hand, when the user applies the pushing force to the object 82, the second rail 24 (and the third rail 26) is moved (pushed) from the extending position E (the opening position K) in the retracting direction D2 relative to the first rail 22, which reduces the pushing force of the second rail 24 relative to the first rail 22. For the user, the user can easily complete the opening action or the retracting action of the slide rail assembly 20, or complete with less of the required force applied, even if the third rail 26 can only be partially mounted to (the side 86 of) the second predetermined portion 82b of the object 82.

Figure 8:
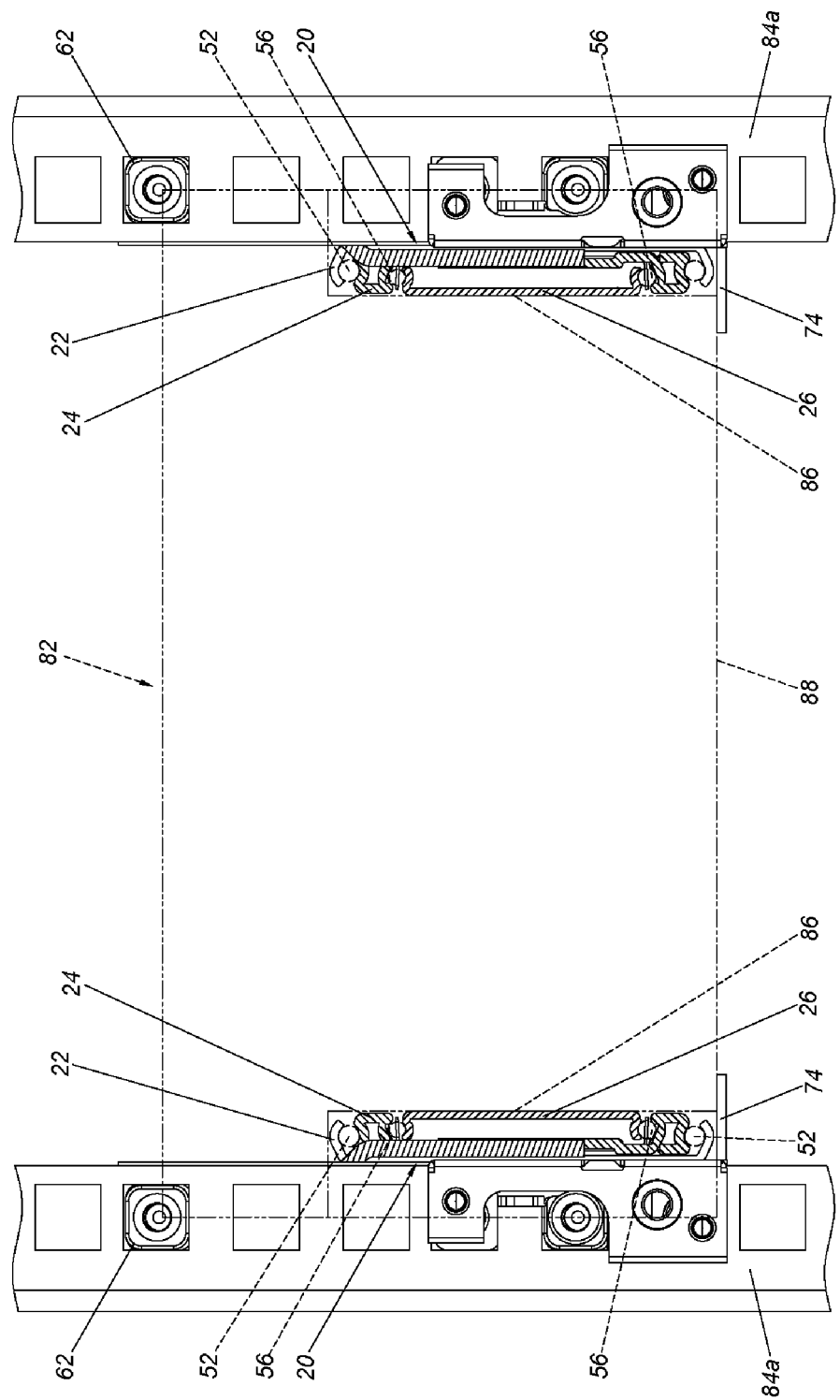
FIG. 8 is another schematic view of the object being able to be mounted to the rack through the pair of slide rail assemblies according to the first embodiment of the present invention.

As shown in FIG. 8, two opposite sides 86 of the second predetermined portion 82b of the object 82 are mounted on the third rail 26 of each of the slide rail assemblies 20. When each of the slide rail assemblies 20 is in the retracted state and/or the extending state, a bottom surface 88 of the object 82 can also be supported by the supporting portion 74. Accordingly, the object 82 can be effectively supported when being moved from the inside of the rack to the outside thereof, or from the outside of the rack to the inside thereof, so as to ensure the smoothness among the rails of each of the slide rail assemblies 20 when being moved relatively to one another, such that the user can easily complete the opening action or the retracting action of the slide rail assembly 20, or complete with less of the required force applied.

Figure 9:
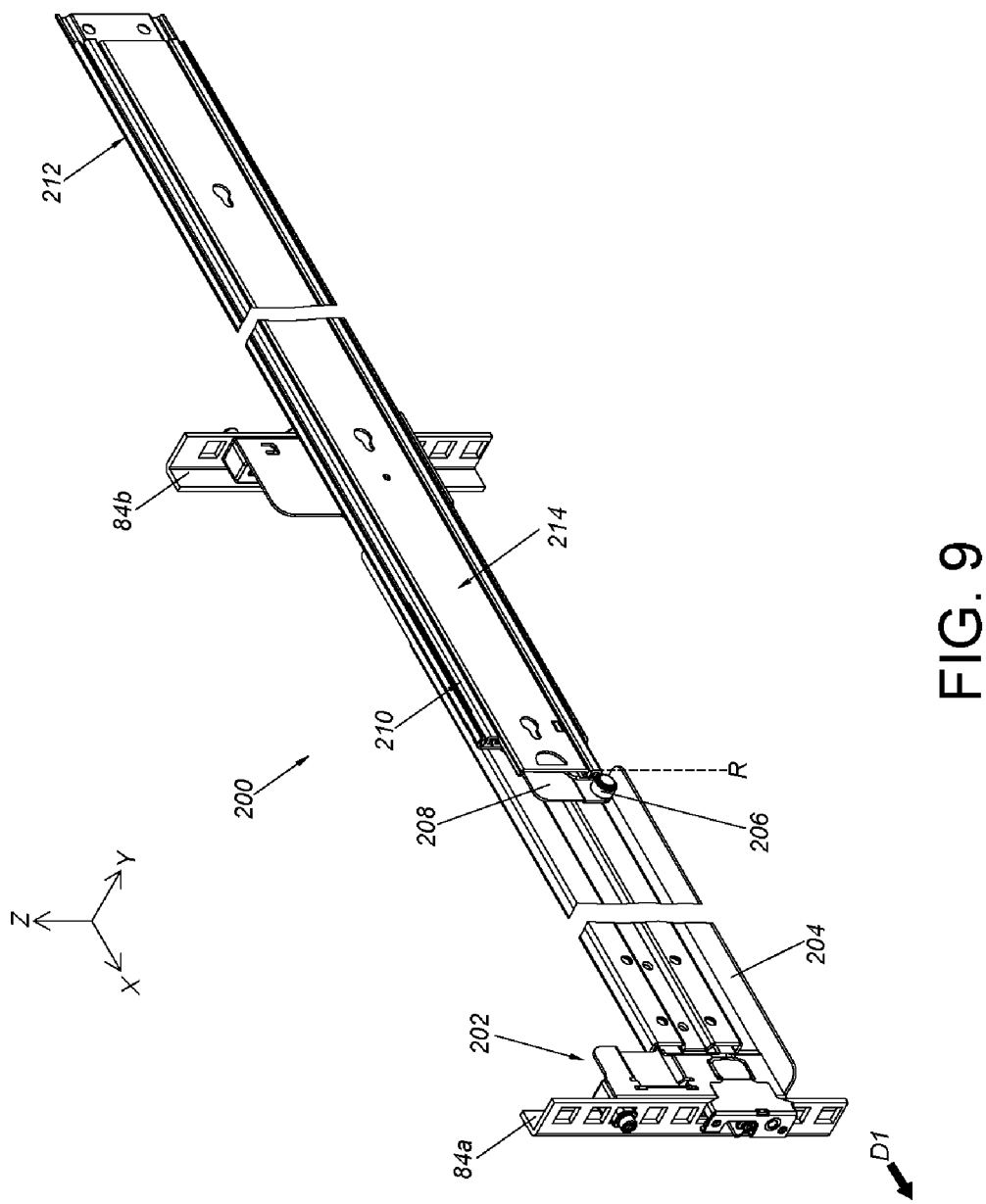
FIG. 9 is a schematic view of a slide rail assembly mounted to the rack and in the retracted state according to a second embodiment of the present invention.
Figure 10:
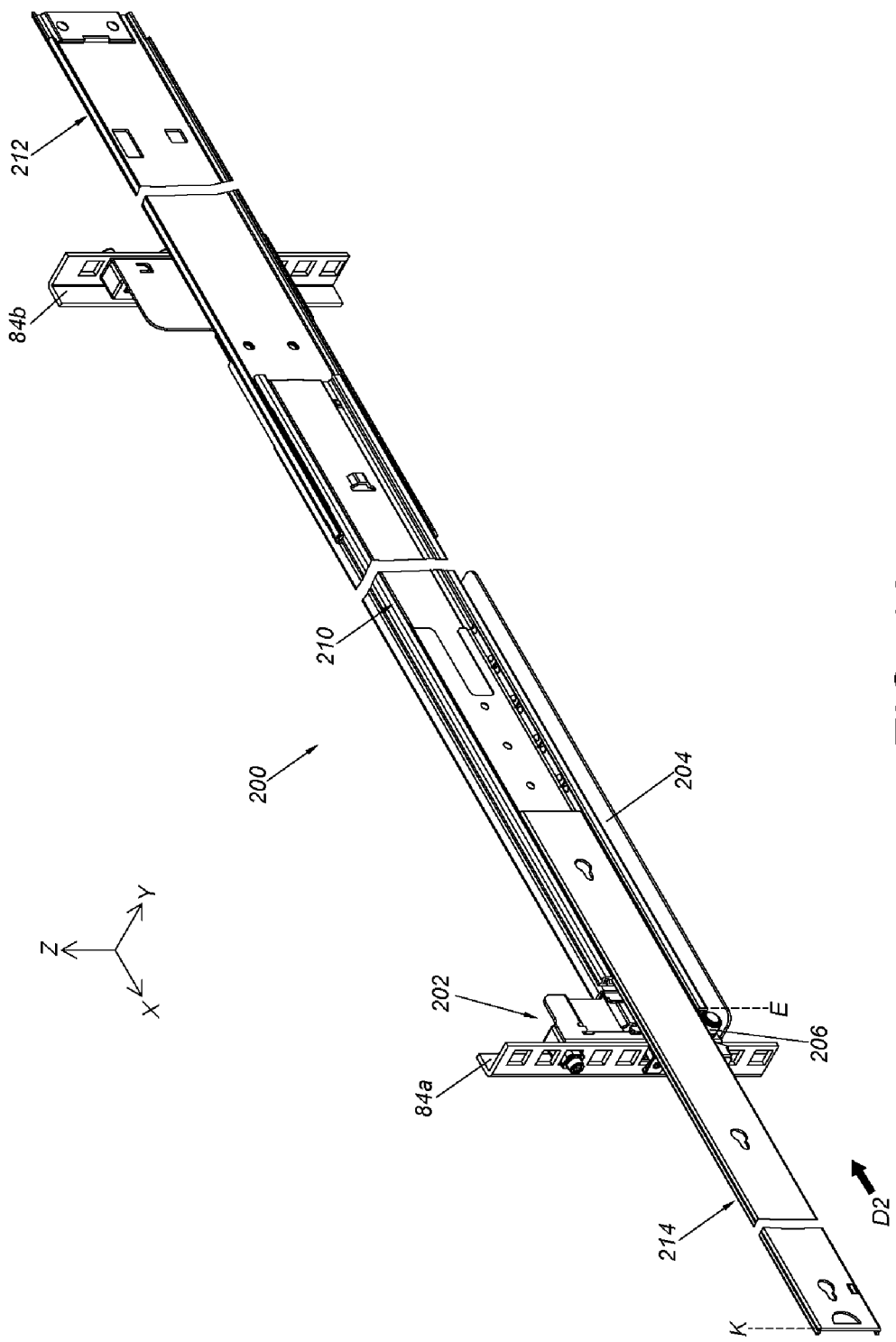
FIG. 10 is a schematic view of the slide rail assembly mounted to the rack and in the extending state according to the second embodiment of the present invention.

As shown in FIG. 9 and FIG. 10, a slide rail assembly 200 according to a second embodiment of the present invention is provided. The difference between the slide rail assembly 200 of the second embodiment and the slide rail assembly 20 of the first embodiment is that a first bracket 202 of the slide rail assembly 200 includes an extending portion 204, at least one supporting member 206 is arranged on an auxiliary member 208, and the at least one supporting member 206 corresponds to the extending portion 204 of the first bracket 202. The extending portion 204 of the first bracket 202 includes a linear section that is substantially longitudinally arranged, and the linear section is configured to support and contact the arced contour of the at least one supporting member 206.

Furthermore, when a second rail 210 is longitudinally moved relative to a first rail 212 from the retracted position R to the extending position E in the opening direction D1, the at least one supporting member 206 supports and contacts along the extending portion 204 of the first supporting bracket 202. On the other hand, when the second rail 210 is moved relative to the first rail 212 from the extending position E to the retracting direction D2 to the retracted position R, the at least one supporting member 206 is supported by and contacted along the extending portion 204 of the first bracket 202. According to this configuration, the technical effects substantially achieved by the first embodiment can also be achieved by the second embodiment. For example, the at least one supporting member 206 and the extending portion 204 of the first bracket 202 are supported by each other through the arced contour and the linear section being contacted with each other, the frictional forces produced when the second rail 210 is moved relative to the first rail 212 are reduced, such that the effect of reducing the required force applied is achieved. Furthermore, when the user applies the pulling force to the above-mentioned object (not shown) carried by a third rail 214, the second rail 210 (and the third rail 214) is moved (pulled) from the retracted position R in the opening direction D1 relative to the first rail 212, which reduces the pulling force of the second rail 210 relative to the first rail 212. On the other hand, when the user applies the pushing force to the object 82, the second rail 210 (and the third rail 214) is moved (pushed) from the extending position E (the opening position K) in the retracting direction D2 relative to the first rail 212, which reduces the pushing force of the second rail 210 relative to the first rail 212. For the user, the user can easily complete an opening action or a retracting action of the slide rail assembly 200, or complete with less of required force applied.

Figure 11:
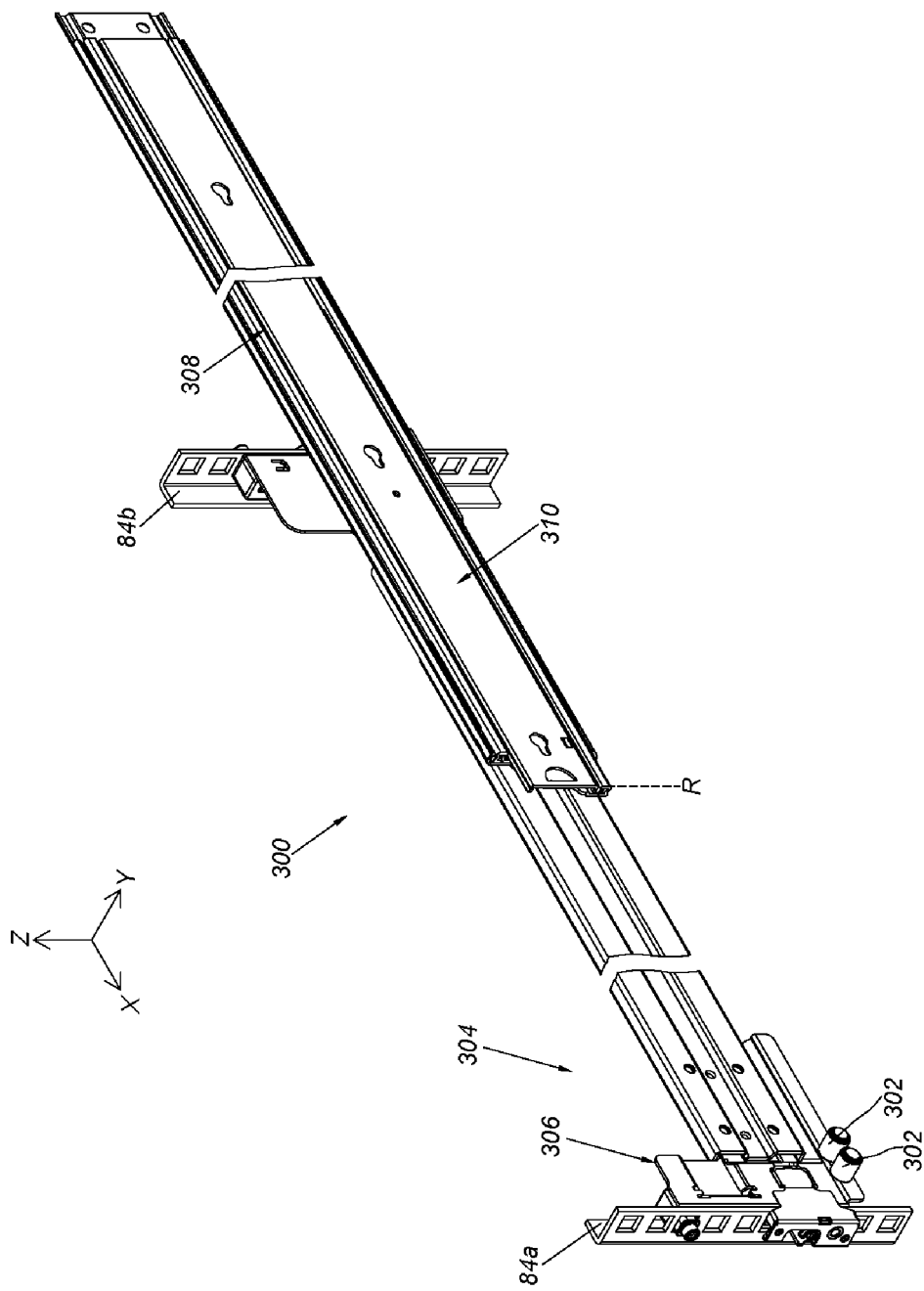
FIG. 11 is a schematic view of a slide rail assembly mounted to the rack and in the retracted state according to a third embodiment of the present invention.
Figure 12:
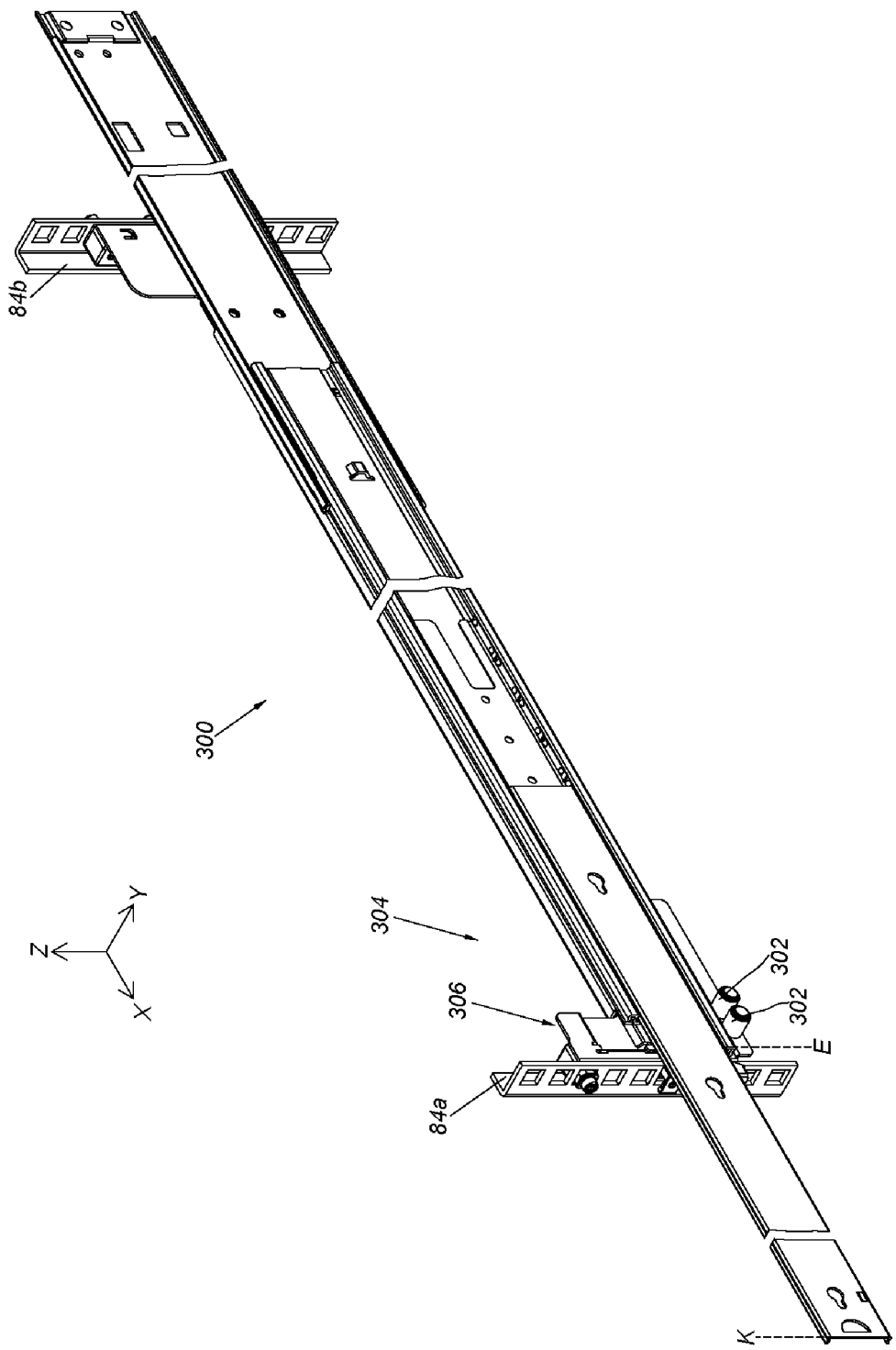
FIG. 12 is a schematic view of the slide rail assembly mounted to the rack and in the extending state according to the third embodiment of the present invention.
Figure 13:
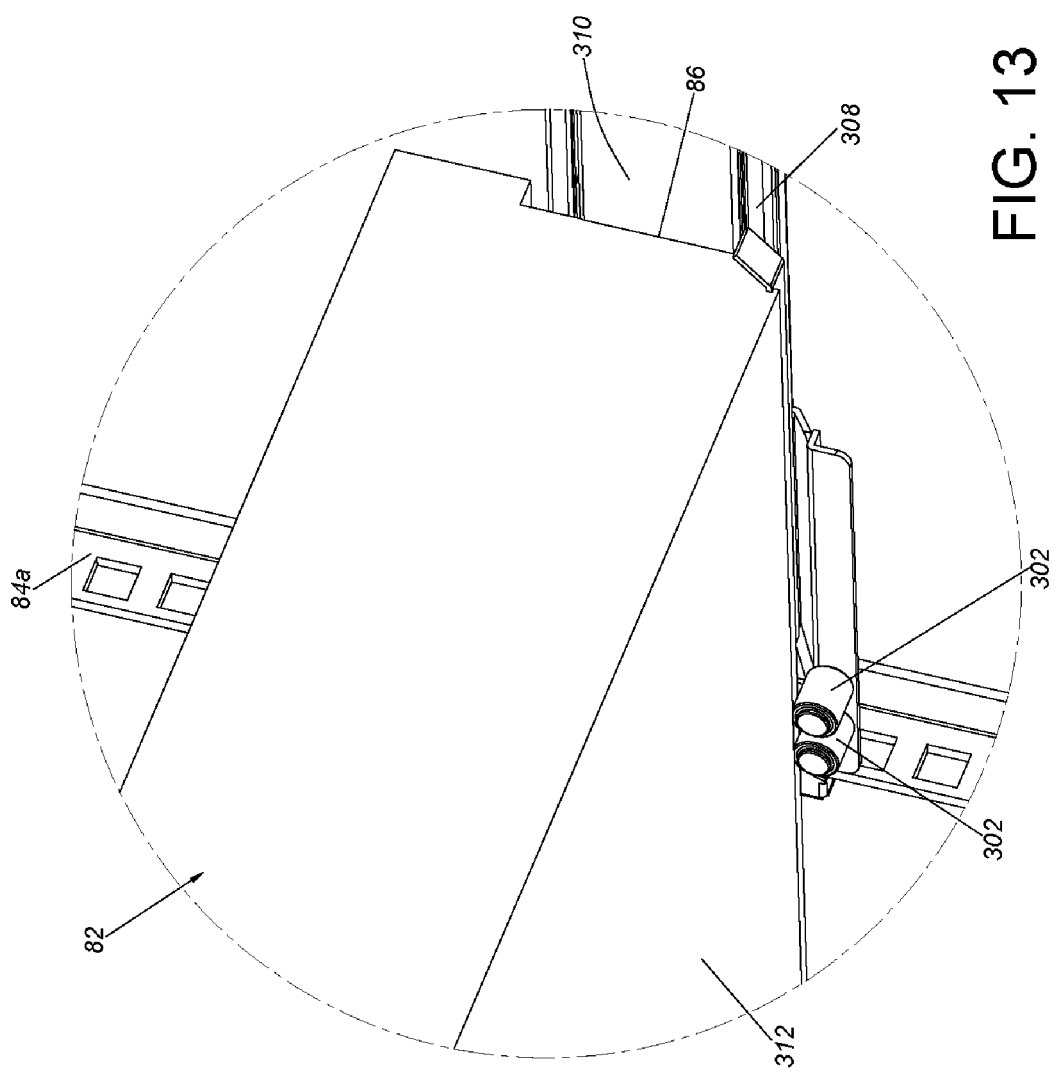
FIG. 13 is a schematic view of the object being able to be mounted to the rack through the slide rail assembly according to the third embodiment of the present invention.

As shown in FIG. 11, FIG. 12, and FIG. 13, a slide rail assembly 300 according to a third embodiment of the present invention is provided. The difference between the slide rail assembly 300 of the third embodiment, and the slide rail assembly 20 of the first embodiment as well as the slide rail assembly 200 of the second embodiment is that at least one supporting member 302 is arranged on a first bracket 306 of a first supporting device 304. When the slide rail assembly 300 is in the extending state (as shown in FIG. 12 or FIG. 13), the at least one supporting member 302 is positioned at a bottom portion of one of a second rail 308 and a third rail 310, and the at least one supporting member 302 is configured to support a bottom surface 312 of the object 82 (as shown in FIG. 13). Since the at least one supporting member 302 and the bottom surface 312 of the object 82 are supported by each other through the arced contour and the linear section being contacted with each other, the frictional forces (friction resistances) are reduced, and the at least one supporting member 302 can be configured to support the object 82. For the user, the user can easily complete an opening action or an retracting action of the slide rail assembly 300, or complete with less of required force applied, even if the third rail 310 can only be partially mounted to (the side 86 of) the second predetermined portion 82b of the object 82.

As shown in FIG. 14, FIG. 15, FIG. 16, and FIG. 17 a slide rail assembly 400 according to a fourth embodiment of the present invention is provided. The difference between the slide rail assembly 400 of the fourth embodiment and the slide rail assembly 20 of the first embodiment is that an auxiliary member 403 on a second rail 402 further includes at least another supporting member 404. The at least another supporting member 404 is configured to cooperate with a third rail 406. Preferably, the auxiliary member 403 is further arranged with an operating member 408.

Figure 14:
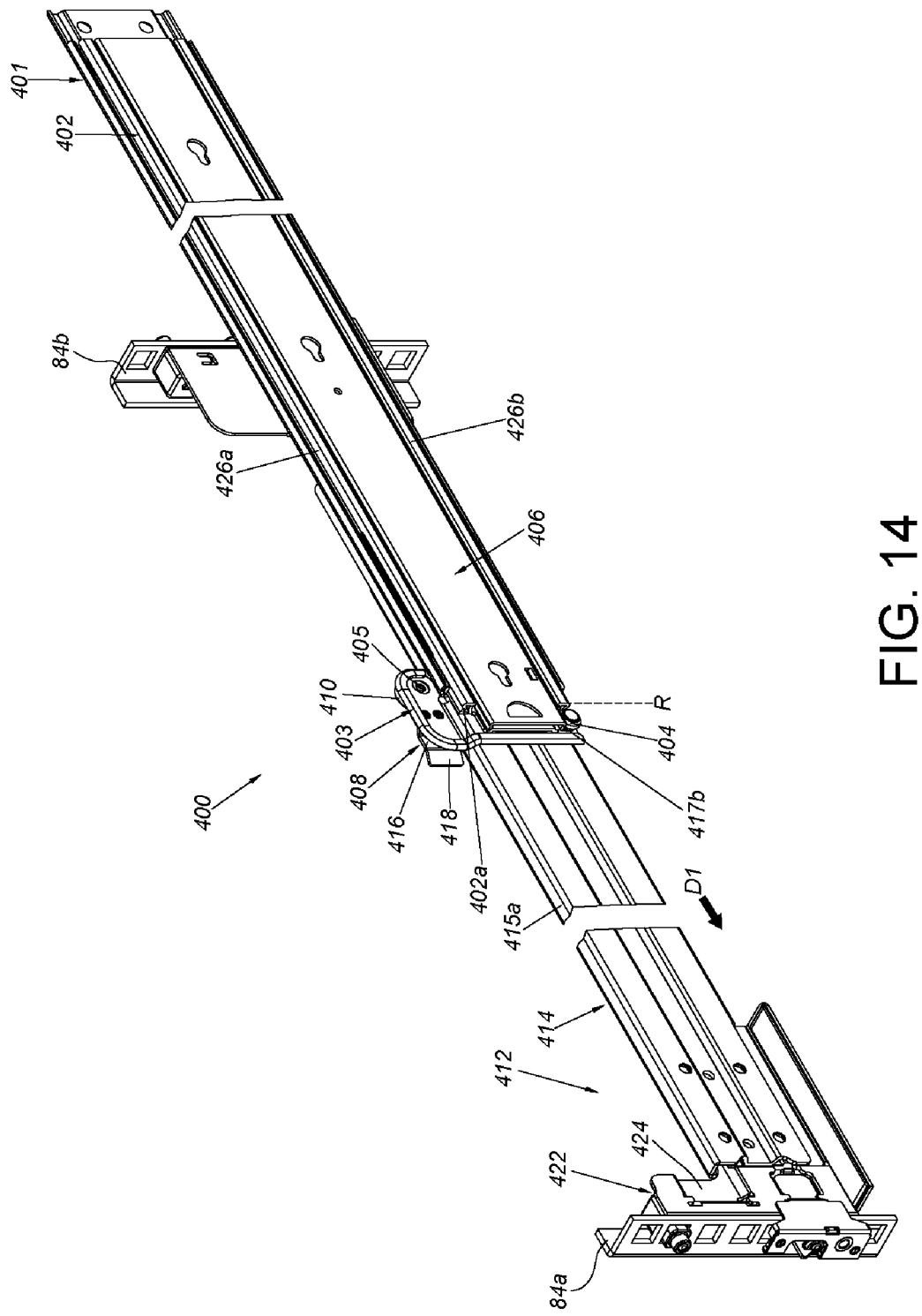
FIG. 14 is a schematic view of the slide rail assembly mounted to the rack and in the retracted state according to a fourth embodiment of the present invention.
Figure 15:
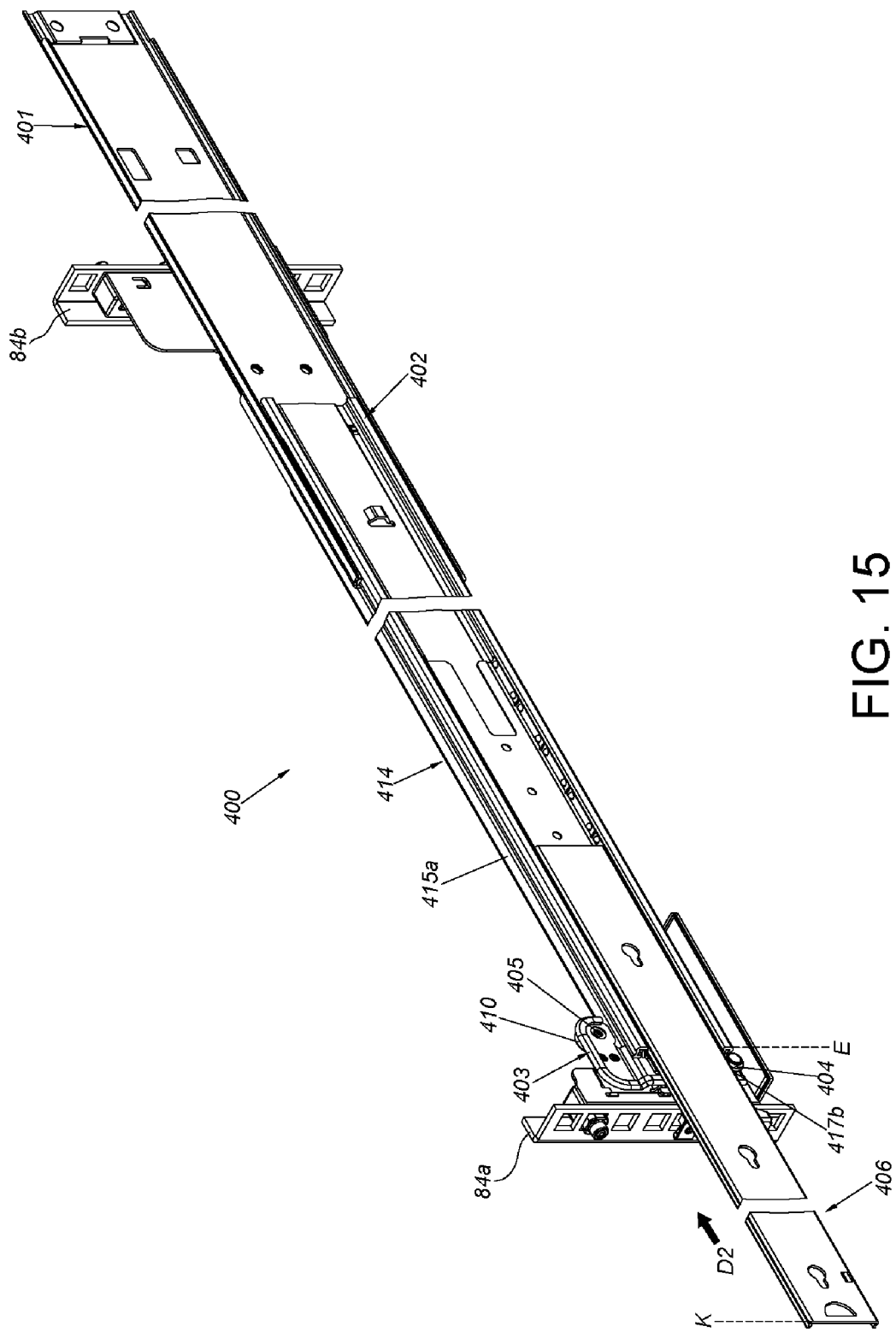
FIG. 15 is a schematic view of a slide rail assembly mounted to the rack and in the extending state according to the fourth embodiment of the present invention.
Figure 16:
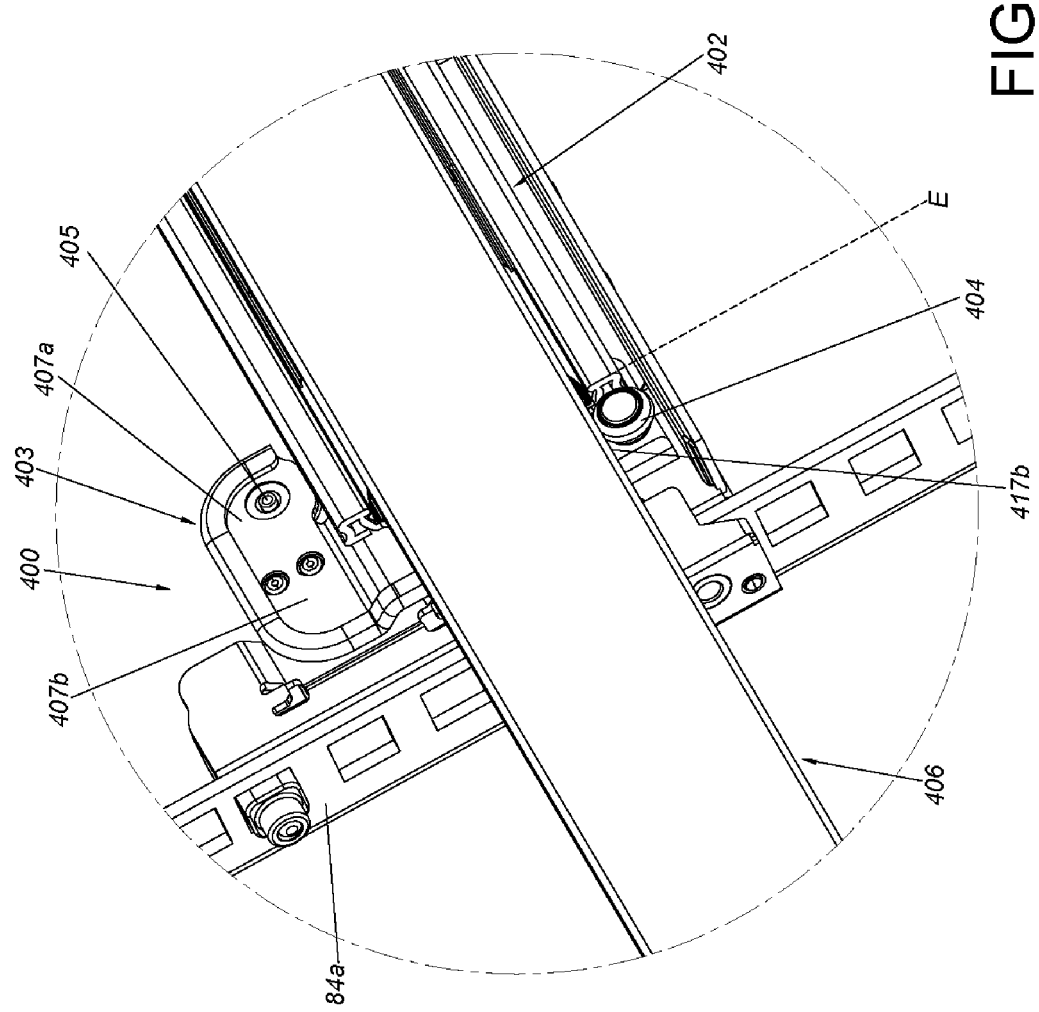
FIG. 16 is a partial schematic view of a first perspective illustrating the slide rail assembly mounted to the rack and in the extending state according to the fourth embodiment of the present invention.

Furthermore, when the second rail 402 is moved relative to a first rail 401 from the retracted position R (as shown in FIG. 14) to the opening direction D1 to the extending position E (as shown in FIG. 15), the second rail 402 can be supported by the supporting member 410 supporting and contacting along a first portion 415a of a reinforcement member 414 of a first supporting device 412. In addition, when the third rail 406 is moved relative to the second rail 402 from the extending position E to the opening position K in the opening direction D1, the at least another supporting member 404 can support and contact a second wall 417b of the third rail 406 (as shown in FIG. 15 or FIG. 16), and vice versa. That is to say, when the second rail 402 is moved relative to the first rail 401 from the extending position E (as shown in FIG. 15) to the retracting direction D2 to the retracted position R, the supporting member 410 can be contacted to the first portion 415a of the reinforcement member 414 of the first supporting device 412. Furthermore, when the third rail 406 is moved relative to the second rail 402 from the opening position K (as shown in FIG. 15) to the retracting direction D2 in the extending position E, the at least another supporting member 404 can support and contact the second wall 417b of the third rail 406. Preferably, the at least another supporting member 404 and the supporting member 410 are respectively exemplified as a rolling member or a smooth member; and can be spherical or cylindrical objects, such as a roller or a ball in practice, but the present invention is not limited thereto.

According to this configuration, the friction forces produced when the second rail 402 is moved relative to the first rail 401 can be reduced by the supporting member 410. On the other hand, the frictional forces produced when third rail 406 is moved relative to the second rail 406 can be reduced through the at least another supporting member 404.

Preferably, the auxiliary member 403 includes a connecting portion, and the connecting portion includes a first connecting section 407a and a second connecting section 407b. The supporting member 410 is mounted to the first connecting section 407a disposed adjacent thereto through a shaft 405, and the operating member 408 is mounted to the second connecting section 407b disposed adjacent thereto (as shown in FIG. 16 and FIG. 17).

Figure 17:
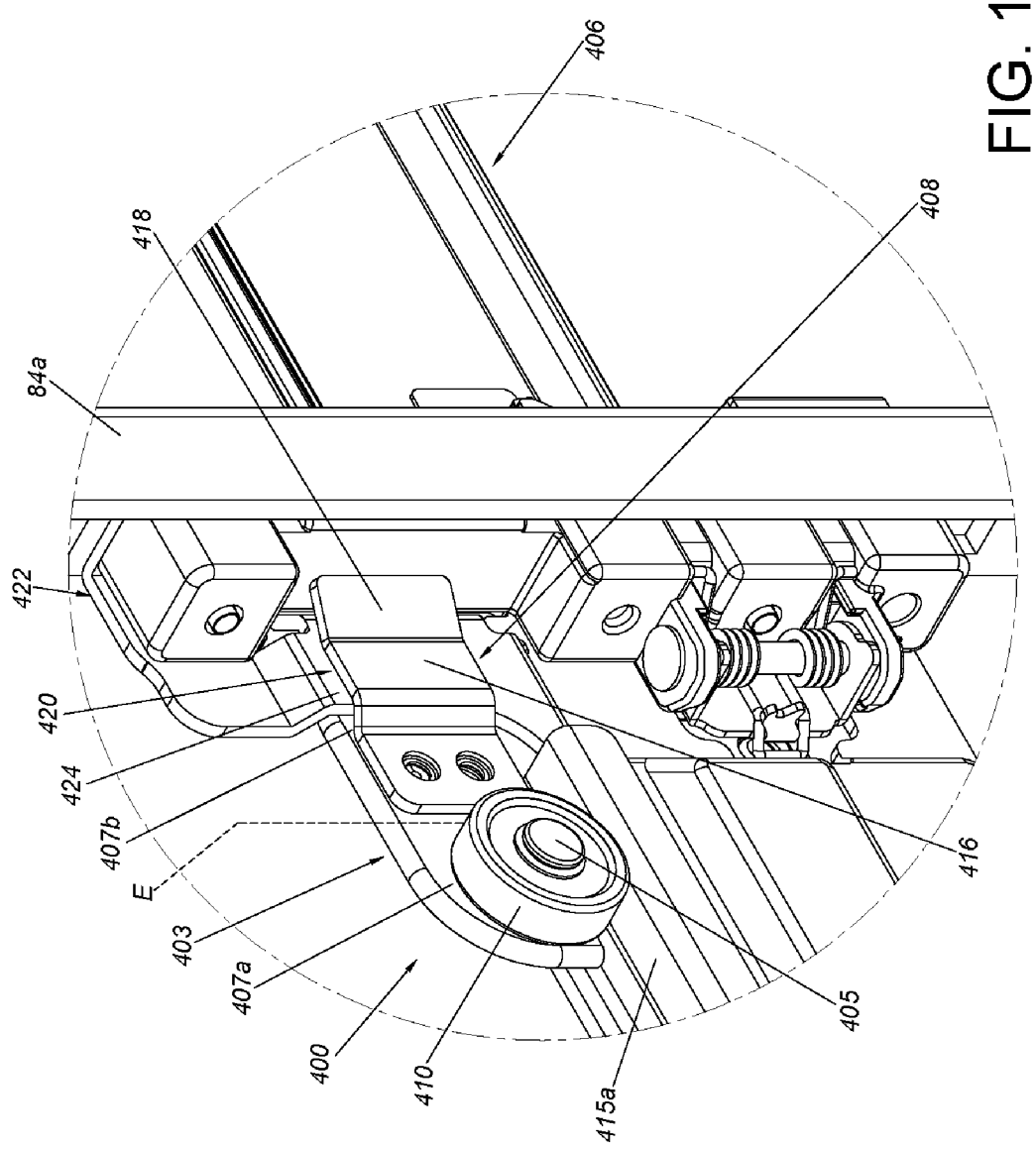
FIG. 17 is a partial schematic view of a second perspective illustrating the slide rail assembly mounted to the rack and in the extending state according to the fourth embodiment of the present invention.

Preferably, the operating member 408 is an elastic member, and the operating member 408 includes an engaging portion 416 and a guiding portion 418 connected to the engaging portion 416 (as shown in FIG. 17). The guiding portion 418 includes an inclined surface or an arced surface. An engaging space 420 is defined between the engaging portion 416 and the second connecting section 407b of the auxiliary member 403. When the second rail 402 is positioned at the extending position E relative to the first rail 401, the engaging portion 416 of the operating member 408 can be engaged with (e.g., buckled, hooked, or attached, but not limited) a side portion 424 of a first bracket 422 through the engaging space 420, since a lateral movement of the second rail 402 at the extending position E can be restricted, so as to prevent the second rail 402 from shaking due to external forces (as shown in FIG. 16 and FIG. 17).

Preferably, the supporting member 410 and the at least another supporting member 404 are respectively disposed adjacent to the first wall 426a and the second wall 426b of the second rail 402, and are disposed adjacent to the first end portion 402a of the second rail 402 (as shown in FIG. 14).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising a first end portion and a second end portion that are opposite to each other;
   a second rail longitudinally movable relative to the first rail from a retracted position to an extending position in an opening direction, the second rail comprising a first end portion and a second end portion that are opposite to each other, the first end portion of the second rail exceeding the first end portion of the first rail when the second rail is positioned at the retracted position relative to the first rail;
   a third rail longitudinally movable relative to the second rail;
   a first supporting device exceeding the first end portion of the first rail for a predetermined longitudinal distance; and
   an auxiliary member connected to the first end portion of the second rail;
   at least one supporting member rotatably mounted on the auxiliary member and configured to support the first supporting device.

2. The slide rail assembly of claim 1, wherein the first supporting device comprises a reinforcement member and a first bracket, the reinforcement member is positioned at a rear side of the first rail, the reinforcement member exceeds the first end portion of the first rail for the predetermined longitudinal distance, and the first bracket is connected to the reinforcement member.

3. The slide rail assembly of claim 2, wherein the reinforcement member comprises a first portion, a second portion, and a longitudinal portion connected between the first portion and the second portion; wherein the at least one supporting member is arranged on the second rail; wherein, when the second rail is longitudinally moved relative to the first rail from the retracted position to the extending position in the opening direction, the at least one supporting member is supported by and contacted along one of the first portion and the second portion of the reinforcement member, and when the second rail is longitudinally moved relative to the first rail from the extending position to the retracted position in a retracting direction, the at least one supporting member is supported by and contacted along one of the first portion and the second portion of the reinforcement member.

4. The slide rail assembly of claim 3, wherein at least one of the at least one supporting member and the first portion and the second portion of the reinforcement member comprises an arced contour.

5. The slide rail assembly of claim 2, wherein the first bracket comprises an extending portion, a direction of the extending portion is substantially longitudinal, and the at least one supporting member is arranged on the second rail; wherein, when the second rail is longitudinally moved relative to the first rail from the retracted position to the extending position in the opening direction, the at least one supporting member supports and contacts along the extending portion of the first bracket, and when the second rail is longitudinally moved relative to the first rail from the extending position to the retracted position in a retracting direction, the at least one supporting member supports and contacts along the extending portion of the first bracket.

6. The slide rail assembly of claim 5, wherein at least one of the at least one supporting member and the extending portion of the first bracket comprises an arced contour.

7. The slide rail assembly of claim 3 further comprising at least another supporting member arranged on the second rail, and when the third rail is moved to an opening position in the opening direction relatively to the second rail positioned at the extending position, the third rail is able to be supported by and contacted to the at least another supporting member, and when the third rail is moved from the opening position in the retracting direction relative to the second rail positioned at the extending position, the third rail is able to be supported by and contacted to the at least another supporting member.

8. The slide rail assembly of claim 2, wherein the at least one supporting member is arranged on the first bracket of the first supporting device; wherein, when the rail assembly is at an extending state, the at least one supporting member is positioned at a bottom portion of one of the second rail and the third rail, and the at least one supporting member is rotatably mounted on the first bracket.

9. The slide rail assembly of claim 2 further comprising a second supporting device movable relative to the first supporting device, the first supporting device comprising at least one first mounting member, the second supporting device comprising at least one second mounting member, and the at least one first mounting member and the at least one second mounting member are configured to mount the first rail to a first post and a second post of a rack.

10. The slide rail assembly of claim 1, wherein the auxiliary member further comprises an operating member, the operating member comprises an engaging portion and a guiding portion connected to the engaging portion, the guiding portion comprises an inclined surface or an arced surface, and an engaging space is defined between the engaging portion and the auxiliary member; wherein, when the second rail is positioned at the extending position, the engaging portion of the operating member is able to be engaged with a side portion of the first bracket.

11. A slide rail assembly, comprising:
    a first rail;
    a second rail longitudinally movable relative to the first rail from a retracted position to an extending position in an opening direction;
    a third rail longitudinally movable relative to the second rail, each of the first rail, the second rail, and the third rail respectively comprising a first end portion and a second end portion;
    a first supporting device exceeding the first end portion of the first rail for a predetermined longitudinal distance;
    an auxiliary member connected to the first end portion of the second rail opposite to the second end portion of the second rail; and
    at least one supporting member rotatably mounted on the auxiliary member;
    wherein, when the second rail is longitudinally moved relative to the first rail from the retracted position to the extending position in the opening direction, the at least one supporting member supports and contacts along an upper edge or an extending portion of a lower edge of the first supporting device;
    wherein one of the at least one supporting member and the first supporting device comprises an arced contour, and another one of the at least one supporting member and the first supporting device comprises a linear section to support and contact with the arced contour;

wherein, when the second rail is positioned at the extending position relative to the first rail, the first end portion of the second rail exceeds the first end portion of the first rail;

wherein, when the second rail is positioned at the retracted position relative to the first rail, the first end portion of the second rail exceeds the first end portion of the first rail;

wherein, when the second rail is positioned at the extending position relative to the first rail, the third rail is able to be moved to an opening position relative to the second rail;

wherein, when the third rail is positioned at the extending position relative to the second rail, the first end portion of the third rail exceeds the first end portion of the second rail.

12. The slide rail assembly of claim 11, wherein the first supporting device comprises a reinforcement member and a first bracket, the reinforcement member connected to the first rail, the reinforcement member exceeds the first end portion of the first rail for the predetermined longitudinal distance, and the first bracket is connected to the reinforcement member.

13. The slide rail assembly of claim 12, wherein, when the second rail is longitudinally moved relative to the first rail from the retracted position to the extending position in the opening direction, the at least one supporting member supports and contacts along one of the reinforcement member and the first bracket, and when the second rail is longitudinally moved relative to the first rail from the extending position to the retracted position in a retracting direction, the at least one supporting member supports and contacts along one of the reinforcement member and the first bracket; wherein the at least one supporting member is a rolling member or a smooth member.

14. The slide rail assembly of claim 13, wherein the at least one supporting member comprises plastic material.

* * * * *